United States Patent [19]
Procter et al.

[11] 3,970,925
[45] July 20, 1976

[54] DIRECT READING REACTANCE METER

[75] Inventors: Samuel Anderson Procter, Minneapolis; Robert Dewitt Younger, Bloomington, both of Minn.

[73] Assignee: Control Data Corporation, Minneapolis, Minn.

[22] Filed: Apr. 28, 1975

[21] Appl. No.: 572,571

Related U.S. Application Data

[63] Continuation-in-part of Ser. No. 468,946, May 10, 1974, abandoned.

[52] U.S. Cl.............................. 324/57 Q; 324/59; 324/60 R
[51] Int. Cl.²......................................... G01R 27/00
[58] Field of Search............ 324/57 Q, 57, 55, 57 R, 324/59, 60 R, 60 C

[56] References Cited
UNITED STATES PATENTS

| | | | |
|---|---|---|---|
| 3,480,857 | 11/1969 | Bialko et al...................... | 324/59 X |
| 3,771,050 | 11/1973 | Golahny et al. .................. | 324/59 X |
| 3,840,805 | 10/1974 | Martyashin et al................ | 324/57 Q |

*Primary Examiner*—Stanley T. Krawczewicz
*Attorney, Agent, or Firm*—Edward L. Schwarz

[57] ABSTRACT

Apparatus for producing an indication of the value of an unknown capacitance or inductance, which employs a variable frequency oscillator producing a sinusoidal output which is fed through a resonant circuit comprising a reactive circuit element of known value selected to attain resonance with the unknown reactor within the oscillator frequency range. A phase detector measures the phase shift between oscillator output voltage and output current, and its direction and supplies a phase shift signal specifying this information to a controller which supplies a frequency control signal to the oscillator. The controller varies the frequency control signal responsive to the phase shift signal to eventually reduce phase shift to 0° or other predetermined value indicating the resonance condition in the circuit. In a preferred embodiment, a series resonance circuit is formed by the known and unknown reactors, and phase shift between oscillator voltage and current is detected by measuring the phase angle of the voltage across the oscillator with respect to that across the capacitor in the series circuit, which angle must be 90° at resonance. This embodiment is particularly well suited to measurement of small inductances in circuits having an appreciable amount of DC resistance.

12 Claims, 3 Drawing Figures

DIRECT READING REACTANCE METER

CROSS-REFERENCE TO RELATED APPLICATION

This application is a continuation in part of U.S. patent application Ser. No. 468,946, filed May 10, 1974 in the name of Samuel A. Procter and Robert D. Younger, now abandoned.

DESCRIPTION OF THE PRIOR ART

1. Field of the Invention

The measurement of capacitance or inductance, particularly when in the presence of a significant amount of DC resistance, is necessary and important in the design of components for magnetic recording. This invention allows such measurements to be easily and accurately made.

2. Description of the Prior Art

The classical methods by which reactor values may be measured employ any of the various kinds of bridges in which a variable impedance in one arm is adjusted until a null appears across the bridge. (The term "reactor value" is preferred to "reactance," since the latter term includes the effect of frequency in determining circuit operation. "Reactor value" means hereafter either the amount of capacitance or the amount of inductance in a circuit element.) Three common bridges are the two Maxwell bridges for comparing two inductances or for comparing an inductance and a capacitance, and the Wein bridge for comparing two capacitances. The disadvantage of using these bridges is that accurate results require a skilled operator and up to one-half hour to complete a single measurement. For measurement of extremely small reactor values, a Q-meter is preferred, employing a fixed frequency oscillator output applied to a series LC circuit, either the capacitance or the inductance being the unknown. Current is measured by a non-reactive hot wire ammeter. When maximum current occurs, the system is in resonance. Resonance is achieved by adjusting one of the reactive elements among known values. Knowing one reactor value and the resonant frequency, the unknown reactor value can then be easily computed. However, when a significant amount of resistance is present in the circuit, the total impedance at resonance may be only slightly lower than the impedance far from resonance, and hence accurate measurements are difficult, if not impossible.

The most pertinent prior art of which we are aware is disclosed in the *Hewlett-Packard Journal*, March 1974, p. 2 which uses a sophisticated bridge and a fixed frequency source with automatic adjustment of either the value of the known reactor or the voltage across it by the use of negative feedback techniques. U.S. Pat. No. 3,771,050 (Golahny) discloses a comparison method for measuring reactor value and details the problems involved in employing balanced bridge measurement. U.S. Pat. No. 3,612,993 (Tims) discloses another comparison-type instrument. U.S. Pat. No. 3,571,703 (Russell) discloses an improvement on the aforementioned Q-meter. U.S. Pat. Nos. 3,711,770; 3,621,385; 3,713,022; 3,718,856; and 1,971,310 all disclose various circuits which have been proposed through the years to measure reactor values.

BRIEF DESCRIPTION OF THE INVENTION

A stable servo loop is employed to control the frequency of a variable frequency oscillator to produce resonance in a series or parallel circuit containing the element of unknown reactor value (although its type must be known, i.e. whether it is capacitive or inductive) and a reactor of opposite type having a known value. The resonant frequency $f_r$ together with the known reactor value permits the unknown reactor value to be computed from the formula:

$$f_r = 1/2\pi \sqrt{LC}$$

where $L$ and $C$ are the respective inductive and capacitive reactor values in the resonant circuit, one of which is known. The phase shift of the oscillator output voltage with respect to its output current is 0° at resonance. A phase detector measures this phase shift and produces a phase shift signal which indicates the amount of shift and whether this shift is leading or lagging. The phase shift signal is supplied to a controller circuit which produces the control signal for the oscillator. The controller circuit shifts its output responsive to the phase shift signal in such a way that the oscillator frequency changes toward and eventually reaches and remains very close to the resonant frequency.

The preferred resonant circuit places the known and unknown impedances in series to produce series resonance. In such a circuit, current flow is maximum at resonance and phase shift easily measured, as explained below. Parallel resonance may also be employed, but since current flow is theoretically zero at resonance in a parallel circuit, measurement of phase shift is difficult. This problem can be avoided to some extent by measuring phase shift at other then resonance as also explained below.

Our preferred way to measure phase shift of the oscillator voltage with respect to the oscillator current is by measuring phase shift across one of the reactors in the series circuit. The phase of the voltage across a purely capacitive or inductive reactor (one having negligible DC resistance) whether at resonance or not, lags or leads, respectively, the current through it by exactly 90°. The phase detector measures the amount and direction of the deviation from 90° of the voltage across the reactor with respect to that across the oscillator, and supplies the required phase shift signal to the controller circuit causing oscillator frequency to shift toward resonance. An indicator circuit receiving the oscillator output (or input) is pre-programmed with the known reactor value. According to known principles, the indicator circuit solves the above equation relating $f_r$, L and C and can easily provide a direct visual output which specifies the value of the unknown reactor in henrys or farads as the case may require.

The set point phase angle need not be exactly 90°, but may be any convenient angle and the unknown reactance then computed from the oscillator frequency achieved for the set point phase angle and the known reactance value. Using a non-resonant phase angle is almost essential if a parallel circuit is employed since almost no current flows through the oscillator and hence comparing the phase angles is difficult. Attempting to measure current instead of comparing phase angle yields imprecise results.

Accordingly, one object of this invention, is to provide a high speed measurement of the value of an unknown reactor.

A second object is to provide an inexpensive yet accurate instrument measuring reactor value.

Another object is to provide an accurate reactor value measurement even though relatively high DC resistance is present within the unknown reactive element.

Still another object of this invention is to make available an instrument allowing an untrained operator to achieve results in making these measurements which are as accurate as may be achieved by a skilled operator.

DESCRIPTION OF THE PREFERRED EMBODIMENTS

Figure 1:
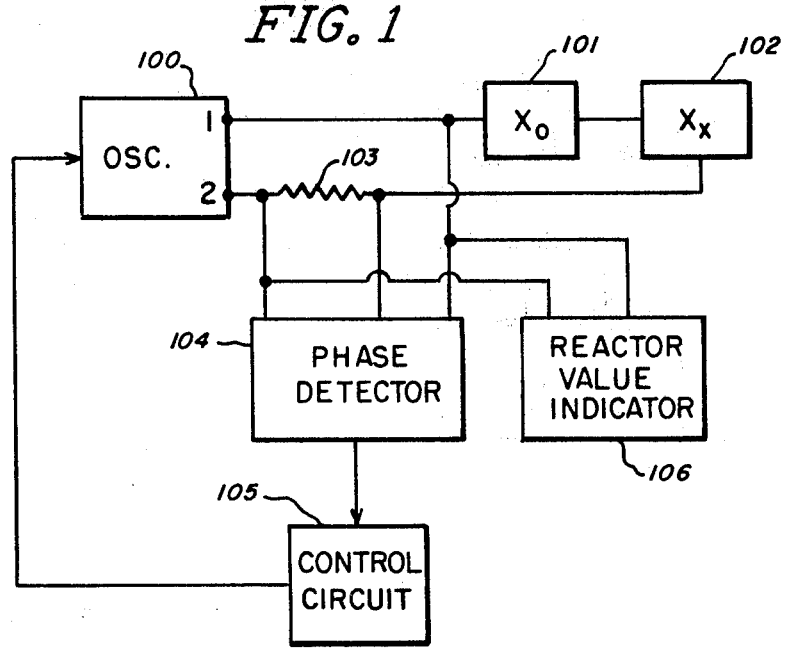
FIG. 1 is a general block diagram of the apparatus.

FIG. 1 discloses a variable frequency oscillator 100 having a substantially sinusoidal output applied through its output terminals 1 and 2 to one terminal of reactive circuit element (reactor) 101 having known capacitance or inductance and to one terminal of resistance 103. Circuit element or reactor 102, of unknown reactor value, completes the circuit between reactor 101 and resistance 103 to form of these three circuit elements a series RLC circuit connected across the output terminals of oscillator 100. Resistance 103 is preferably quite small. The frequency of oscillator 100 is controlled by a frequency control signal received from controller or control circuit 105.

It is of course, well known that a series RLC circuit is in resonance when the phase shift of the voltage across the supply (oscillator 100) with respect to the current flow through it, is 0°. No way of directly determining phase of the current is known. However, voltage across a resistor through which the current is flowing is always exactly in phase with the current, so the phase of this voltage may be employed as an exact though indirect indication of the current phase. Accordingly, the phase of the voltage across resistor 103 is compared with the phase of the output voltage of oscillator 100, by phase detector 104 which supplies a phase shift signal to control circuit 105 specifying the amount and direction of phase shift between the voltage and the current of the output of oscillator 100. Control circuit 105 uses this signal in changing the frequency control signal to oscillator 100. Oscillator 100 is preferably of the type which rapidly changes its output frequency in response to changes in its control signal.

The reactor value of circuit element 101 must be chosen so it can be placed in series resonance with unknown element 102 at some frequency within the frequency range of oscillator 100. Thus, if the unknown value of element 102 is capacitive, then known element 101 must be inductive. If unknown element 102 is inductive, then known element 101 must be capacitive. Reactor value indicator 106 receives the output signal from oscillator 100, and indicates the reactor value of unknown element 102 on the basis of the actual frequency of oscillator 100 output at resonance and the internal programming in it of the known value of element 101.

The purpose of phase detector 104 and control circuit 105 is to change frequency of oscillator 100 until the phase shift between its voltage and current is 0°. In operation, phase detector 104 continually monitors the phase difference between the output voltage and current of oscillator 100 and supplies the phase shift signal to control circuit 105 which specifies the voltage phase relationship with the current. Circuits which perform such detection are well known in the art. One suitable is disclosed in conjunction with FIG. 2.

If phase detector 104 indicates that oscillator 100 output voltage leads its current then inductive reactance is greater than capacitive reactance. Control circuit 105 changes its frequency control output to oscillator 100 to cause oscillator frequency to decrease, thereby steering the frequency closer to resonance with circuit elements 101, 102 and 103. If phase detector 104 produces an output indicating that oscillator 100 voltage lags its current, control circuit 105 changes its output signal in such a way that the frequency of the output of oscillator 100 increases, decreasing reactance of the capacitive and increasing reactance of the inductive element. In both the voltage leading current and voltage lagging current case, the change in oscillator 100 frequency tends to decrease the phase angle between its output voltage and its current. The decrease in phase angle is detected by phase detector 104 whose output is correspondingly modified thereby to cause control circuit 105 to change its own output, and therefore also oscillator 100 frequency, more slowly. Proper limits on the rate of change of frequency in this feedback loop makes it stable, and change in oscillator frequency to eventually cease, when the phase angle between its output voltage and current reaches the 0° set point. This achieves resonance in the series RLC circuit. Design of feedback systems is well known in the art, so proper selection of parameters for stability of the system is considered to be a trivial task.

Reactor value indicator 106 contains a preprogrammed constant indicating the value of known element 101. The final frequency attained by oscillator 100 then allows reactor value indicator 106 to solve the equation set out earlier, for the capacitance or inductance of unknown element 102. Applicants have determined that this general scheme yields accuracy significantly higher than that available with the prior art because the effect of resistor 103 is largely eliminated in achieving resonance. Phase angle can be measured much more accurately than changes in total power absorption by the RLC circuit, which is the conventional method.

Without compensation, the reactor value computed for element 102 will include effects of stray reactance throughout the system. By shorting across element 102, the actual value of this stray reactance may be measured and computed, in the same fashion the previous measurement was made. It is possible that this stray reactance will be of such a small value relative to that of element 102 that oscillator 100 frequency range will not be great enough to establish resonance for it and reactor 101 alone in the circuit. If such is the case, a reactor having a value which will increase inductance or capacitance to cause resonance within the oscillator 100 frequency range when element 102 is shorted can be added in series to the circuit. The decrease in resonant frequency thereby achieved when element 102 is shorted permits calibration of indicator 106.

Figure 2:
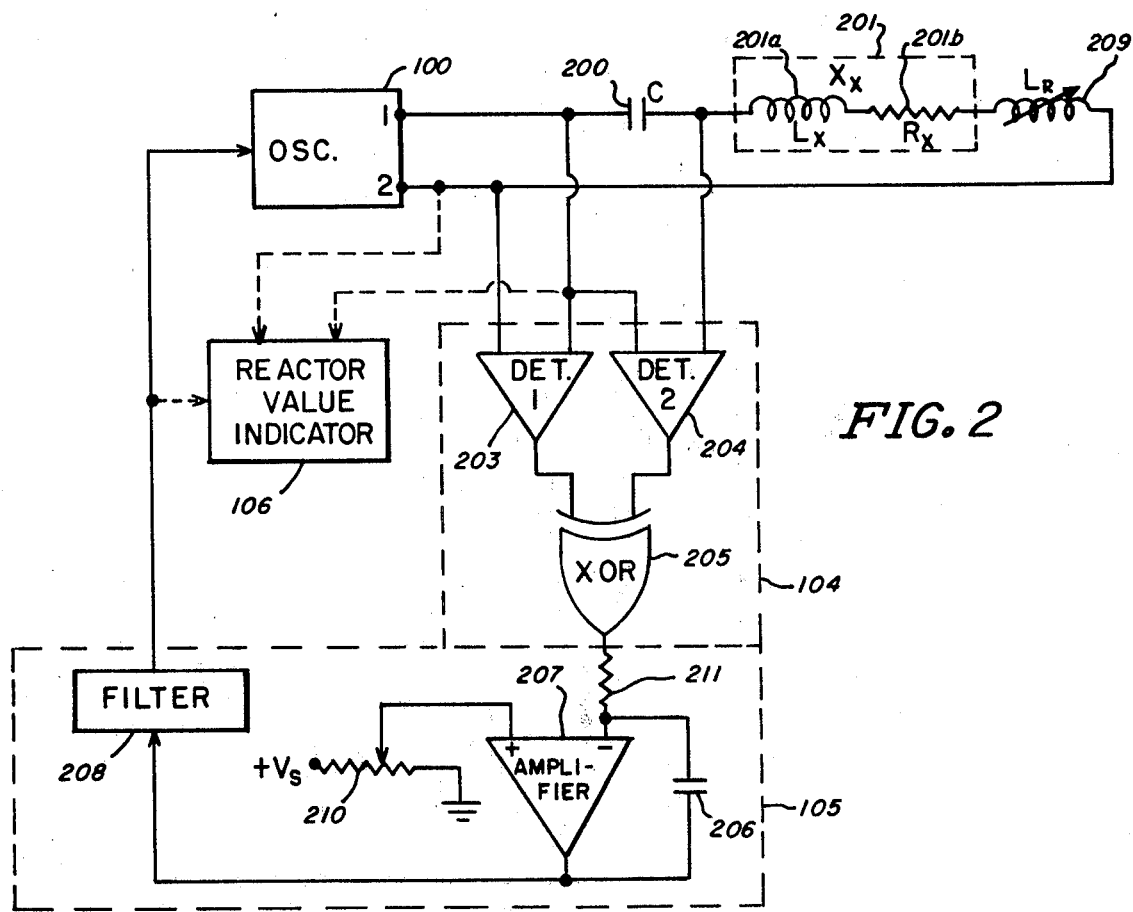
FIG. 2 is a detailed block diagram of a preferred embodiment.

FIG. 2 discloses a preferred embodiment of the apparatus of FIG. 1, adapted to measure the inductance of unknown inductive circuit element 201, corresponding to element 102, in FIG. 1. The function of known element 101 is performed by capacitor 200, whose value is accurately known. Unknown inductance 201 is displayed as broken down into its two component elements, reactive component 201a and resistive component 201b. Variable inductor 209 may be changed to any one of several known values, and forms a portion of the inductance in the series RLC circuit. Inputs to phase detector 104 are from the terminals of capacitor 200 and the terminals of oscillator 100. Phase detector 104 comprises first and second identical crossover detectors 203 and 204 receiving these inputs, whose outputs are supplied to exclusive OR gate 205, the third distinct element of phase detector 104. Control circuit 105 comprises a high gain amplifier 207 receiving the output of exclusive OR gate 205 at its "−" input terminal through resistor 211 and a set point voltage from resistor 210 at its "+" input terminal. The output of amplifier 207 is connected to its own − input terminal by capacitor 206, thereby causing its output to form the time integral of the difference between the voltages at the + and − terminals. Absent capacitor 206, the output voltage of amplifier 207 is equal to the + terminal voltage less the − terminal voltage times a large positive constant, and may shift from a negative to a positive value, as − terminal voltage is respectively greater or less than + terminal voltage. For this particular use, it is preferred that output of amplifier 207 be clamped in some convenient way to restrict its output voltage excursions to the range of oscillator 100 input voltage necessary to achieve the desired oscillator output frequency range. For convenience amplifier 206, resistor 211, and capacitor 206 will be hereafter referred to as the integrator, since that is, in fact, the function they perform in concert on the input voltage difference. The output of the integrator is filtered by low pass filter 208 to remove high frequency components and applied to the control terminal of oscillator 100 to control the frequency of its output. Oscillator 100 is of the type whose frequency varies monotonically, increasing with increasing control signal voltage over a preselected range, which, for an inductance range of 0 to 1.0 uhy., may conveniently be from 1.5 to 2.2 mhz. Reactor value indicator 106 may either receive oscillator 100 output directly and use its frequency in determining the value of inductor 102 or employ the input frequency control voltage to oscillator 100. Which signal is used is immaterial to the invention.

In explaining the operation of FIG. 2, it is important to realize that in a RLC series circuit receiving sinusoidal current from a supply, the phase shift of the voltage across any capacitor is 90° lagging at all times with respect to current through it. Thus, sensing voltage phase shift across capacitor 200 provides an indirect measure of current phase, as does resistor 103 for the circuit of FIG. 1. This is true whether other capacitance is present in the RLC circuit or not, although all capacitance in the circuit affects its frequency. Because inherent resistance in either a capacitor or inductor will affect voltage phase shift across the circuit element, it is necessary to eliminate its effect as much as possible. This is the consideration leading to the selection of voltage across capacitor 200 as the reference voltage, rather than using the 90° leading shift across an inductor. The inherent resistance 201b in an inductor is orders of magnitude higher than stray parallel resistance in a capacitor, assuming good quality components in each case.

Figure 3:
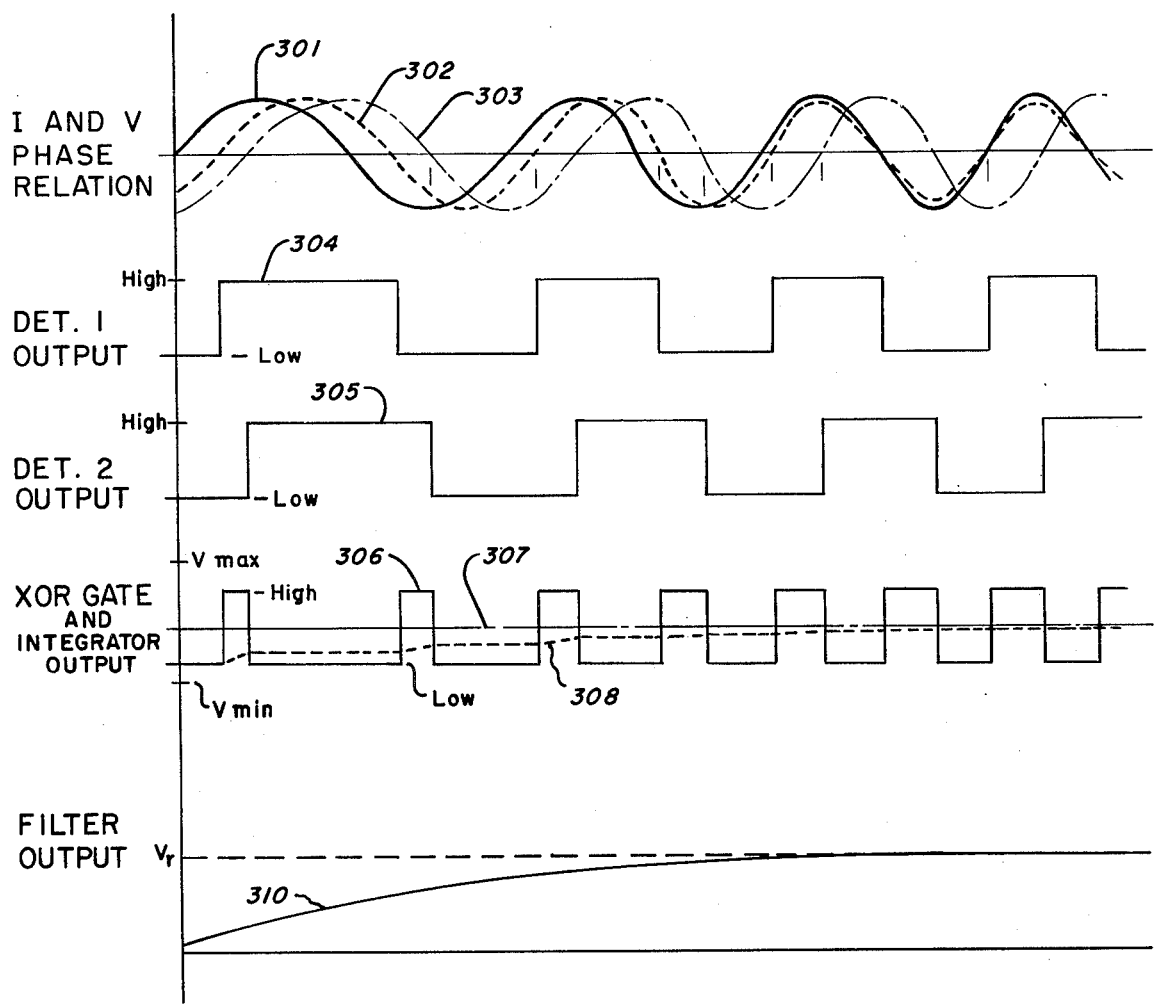
FIG. 3 is a graph of waveforms associated with the operation of the apparatus of FIG. 2.

FIG. 3 displays typical waveforms associated with the operation of the apparatus in FIG. 2 as it pulls oscillator 100 frequency into resonance. The operation is displayed on a greatly shortened time scale and with a relatively few number of cycles of oscillator 100 output so as to simplify explanation. In actual operation, several hundred or more cycles of oscillator 100 output might be necessary to shift its frequency from a distant non-resonant condition, to resonance. Waveform 304 displays the output of first crossover detector 203. When voltage across terminal 1 of oscillator 100 (waveform 302) becomes positive with respect to terminal 2, crossover detector 203 output becomes high as shown, and when terminal 1 voltage crosses terminal 2 voltage in the negative direction, goes to its low condition. Second crossover detector 204 similarly changes its output (waveform 305) to indicate the times and directions capacitor 200 terminal 2 voltage crosses that at its terminal 1, as displayed by waveform 303 in FIG. 3. Capacitor voltage waveform 303 is shown lagging oscillator 100 voltage (waveform 302) by less than 90°, since oscillator 100 frequency is shown as being below resonance. Exclusive OR circuit 205 is of conventional design, and provides its high output as shown in waveform 306 when a single one of its two inputs from crossover detectors 203 and 204 is high, and its low output when neither or both inputs from crossover detectors 203 and 204 are high. When voltage waveforms 302 and 303 are exactly 90° out of phase, the output of exclusive OR circuit 205 will be exactly balanced, i.e. each interval of high output is equal to each interval of low output. This is illustrated in FIG. 3 by the later parts of waveforms 304, 305, and 306, where voltage waveform 302 is exactly in phase with current waveform 301 and 90° out of phase with capacitor voltage waveform 303. The frequency of the output of exclusive OR gate 205 is twice that of the fundamental current waveform 301. Integrator output will be assumed to have an unshifted voltage level with respect to its inputs as shown by waveform 308, although such a change may be likely or desirable, if for example a level change is required to place the output within the required range of oscillator 100 input. When the high portions of waveform 306 are very narrow compared to the intervals between them, the integral will be correspondingly low, as waveform 308 illustrates. As the pulses of waveform 306 become more balanced, waveform 308 approaches the balance of set point voltage 307 more closely. The set point voltage input to amplifier 207 is preselected during a standard calibration operation to be a slight amount above the average of the high and low voltage levels from crossover detectors 203 and 204, as is indicated by line 307. The output of the integrator can vary from its maximum allowable voltage $V_{max}$ (waveform 306) to its minimum voltage $V_{min}$ accordingly as the output of exclusive OR gate 205 swings respectively further from or closer to the set point voltages. These limits can be imposed by suitable diode clamps on the output of amplifier 207.

In FIG. 3, the voltage between terminals 1 and 2 of oscillator 100, waveform 302, is shown as lagging current waveform 301, and therefore less than 90° out of phase with capacitor voltage waveform 303. This means that reactance of capacitor 200 is too great and reactance of inductor 201 is too small respectively, and frequency must therefore be increased. The output of first crossover detector 203 (waveform 304) leads the output of second crossover detector 204 (waveform 305) by less than 90° and the output of exclusive OR gate 205 is therefore low, and less than the set point voltage much greater than half the time. The output of the integrator thus shifts toward $V_{max}$ at a rate which decreases as set point voltage 307 is approached. When waveform 308 reaches the point just below the set point voltage which produces an output voltage from the integrator which exactly averages the input voltage $V_r$ to oscillator 100 necessary to produce resonance, oscillator 100 frequency stops changing, since this condition will stabilize both integrator and filter 208 outputs. Filter 208 receives the output of amplifier 207 and capacitor 206 and integrates (averages) it, producing an output having waveform 310. Filter 208 output voltage reaching $V_r$ results in resonance and stabilization of oscillator 100 frequency. Whenever oscillator 100 frequency is too high, the output of exclusive OR gate 205 becomes high greater than 50% of the time, the output of the integrator slowly decreases and causes oscillator 100 frequency to slowly shift downwardly. In this manner, oscillator 100 output is maintained at or very near the resonant frequency of the series circuit.

Reactor value indicator 106 is shown by dotted lines as having as an input from both the output of filter 208 and the output of oscillator 100. This is intended to denote alternative methods of providing the desired reactor value indication. The frequency can be used as explained for FIG. 1, to directly determine total inductance present. It is also possible to use the output of filter 208 since a direct functional relationship exists between the frequency of oscillator 100 and the output of filter 208. Converting the analog value to a visual indication of the reactor value of circuit element 102 is a trivial task, and may be done, e.g. as simply as by a properly calibrated voltmeter. The known value of inductor 209, as well as any stray reactance must be of course used to adjust the value of the total computed inductance in the RLC circuit.

Known inductor 209 has been provided for two reasons. The value of inductor 201 may be too small to permit resonance within oscillator 100 frequency range, so inductor 201 will reduce the resonant frequency to within this range. The problem of calibration previously discussed also makes insertion of inductor 209 desirable. By varying its value, the range of measurable values of inductor 201 may also be conveniently extended.

It is also possible to provide switching apparatus allowing the substitution of several known capacitances for capacitor 200 to provide a similar range switching function for the apparatus. Insert of each different capacitor or the changing of the value of inductor 201 can be accompanied by an operation which automatically programs reactor value indicator 106 to provide the correct unknown inductor 201 value indication for each selected capacitor or inductor value. It is also possible to make known capacitor or inductor selection automatic by allowing oscillator 100 to sweep through its frequency range for each capacitor or inductor, stepping from one known reactor value to another until resonance is detected. Many other variations are also possible to increase the accuracy and convenience of the device.

In implementing measurement of reactor values, it is not necessary to achieve resonance in a series circuit as described above. A set point phase shift other than 0° may be selected and the feedback control elements adjust frequency to achieve this phase shift. Such a phase shift is more difficult and expensive to measure, which is why it is not a preferred embodiment. However, given the known values of oscillator 100 phase shift and frequency and reactor 101, the value of unknown reactor 102 can be easily calculated according to elementary A.C. circuit theory. It should be understood that known reactor 101 and unknown reactor 102 must have reactances of opposite type, i.e. one must be capacitive, the other inductive, even in such an embodiment where resonance is not achieved.

Neither is it necessary to employ a series circuit. A parallel, or tank circuit may also be employed. However, analysis is complicated by the inherent resistance in the inductive branch of the tank circuit. And as previously mentioned, at resonance, the impedance of a purely reactive tank circuit is infinite, making detection of current phase angle difficult. It is possible to use a non-resonant set point phase angle, but this has all the disadvantages mentioned in connection with the series circuit, and has the additional disadvantage mentioned of more difficult analysis.

It is also theoretically possible to use a non-sinusoidal oscillator output. However, analysis of such waveforms is extremely complex and unnecessary since the sinusoidal waveforms are completely adequate for the purpose. Many other such embodiments may be used to employ the principles of this invention, but are not preferred because of difficulties in implementation, such as those briefly described above.

Having thus described the invention what is claimed is:

1. Apparatus for generating a signal indicative of the unknown value of a first reactive circuit element having first and second terminals, whose value is within a predetermined range, comprising:
    a. an oscillator supplying across first and second output terminals the first of which is connected to the first terminal of the first circuit element, an approximately sinusoidal voltage output signal whose frequency varies within a predetermined range as a function of an input signal, and is the required unknown element value indication;
    b. a second reactive circuit element of known value having a first terminal connected to the second oscillator terminal and a second terminal connected to the second terminal of the first circuit element and of preselected value allowing resonance with the first circuit element at some frequency within the frequency range of the oscillator;
    c. means through which oscillator current passes, for producing a signal specifying phase of the oscillator current;
    d. a phase detector receiving the oscillator current phase signal and the oscillator voltage and producing a signal indicating the phase relationship between oscillator voltage and current; and
    e. control means receiving the phase detector output signal for supplying the input signal to the oscillator and for varying the input signal to the oscillator to shift the oscillator output frequency so as to drive the phase shift between the oscillator output voltage and current progressively toward a predetermined set point.

2. The apparatus of claim 1, wherein the means producing the oscillator current phase signal comprises a resistor in series with the first and second circuit elements.

3. The apparatus of claim 1, wherein the means producing the oscillator current phase signal comprises a capacitor.

4. The apparatus of claim 3, wherein the capacitor comprises one of the reactive circuit elements.

5. The apparatus of claim 1, wherein the phase detector comprises means for producing a signal comprising rectangular pulses whose time average indicates sign and size of the phase angle between oscillator voltage and current.

6. The apparatus of claim 1, wherein the phase detector comprises means for producing a signal whose time average varies monotonically between a first predetermined voltage indicating a predetermined oscillator output voltage lag with respect to current to a second predetermined voltage indicating a predetermined lead of oscillating output voltage with respect to current; wherein the control means comprises a set point generator producing a set point voltage having a predetermined value encoding the value of the phase detector signal time average which corresponding to zero phase shift of oscillator voltage with respect to current, and means for producing an oscillator input signal which shifts toward a third preselected voltage when the phase detector signal time average is between the first and set point voltages and shifts toward a fourth preselected voltage when the phase detector signal time average is between the second and set point voltages; and wherein the oscillator is of the type whose output frequency varies monotonically with the input signal, and is higher when at the third voltage than at any other voltage between the third and fourth voltages.

7. The apparatus of claim 6 wherein the oscillator input signal producing means comprises an integrating amplifier producing a signal following the integral of the difference between the set point and the phase detector signals.

8. The apparatus of claim 7, wherein the oscillator input signal producing means comprises further a low pass filter receiving the integrating amplifier output and supplying the oscillator input.

9. The apparatus of claim 1, further comprising a third reactive element in series connection with the first and second reactive elements and of preselected value allowing series resonance with the second reactive element, and with the first reactive element both shorted and unshorted, within the oscillator frequency range.

10. The apparatus of claim 9, including means for shorting the first reactive element.

11. Apparatus for generating a signal indicative of the unknown value of a first reactive element having first and second terminals, whose value is within a predetermined range, comprising:

a. an oscillator supplying across first and second output terminals the first of which is connected to the first terminal of the first circuit element, an approximately sinusoidal voltage output signal whose frequency varies within a predetermined range as a function of an input signal, and is the required unknown element value indication;

b. a second reactive circuit element connected to the first reactive element to form therewith a circuit having a resonant frequency and which receives the oscillator output;

c. means receiving the oscillator current for producing a signal specifying phase of the oscillator current;

d. a phase detector receiving the oscillator current phase signal and the oscillator voltage and producing a signal indicating the phase relationship between oscillator voltage and current; and e. control means receiving the phase detector output signal for supplying the input signal to the oscillator and for varying the input signal to the oscillator to shift the oscillator output frequency so as to drive the phase shift between the oscillator output voltage and current progressively toward a predetermined value.

12. The apparatus of claim 11, wherein control means further comprises means for varying the input signal to the oscillator to shift the oscillator output frequency so as to drive the phase shift between the oscillator output voltage and current progressively toward zero.

* * * * *